(12) United States Patent
Kaczynski

(10) Patent No.: US 7,768,363 B1
(45) Date of Patent: Aug. 3, 2010

(54) INTER-STAGE COUPLING WITH A TRANSFORMER AND PARALLEL AC-COUPLING CAPACITOR

(75) Inventor: Brian J. Kaczynski, Santa Clara, CA (US)

(73) Assignee: Atheros Communications, Inc., Santa Clara, CA (US)

( * ) Notice: Subject to any disclaimer, the term of this patent is extended or adjusted under 35 U.S.C. 154(b) by 61 days.

(21) Appl. No.: 11/847,268

(22) Filed: Aug. 29, 2007

(51) Int. Cl.
*H01P 5/04* (2006.01)
*H03H 7/01* (2006.01)

(52) U.S. Cl. ............... 333/178; 333/180; 333/24 R

(58) Field of Classification Search ............ 333/177, 333/178, 180, 24 R
See application file for complete search history.

(56) References Cited

U.S. PATENT DOCUMENTS

| | | | | |
|---|---|---|---|---|
| 3,717,808 A | * | 2/1973 | Horna | ............... 323/305 |
| 4,816,784 A | * | 3/1989 | Rabjohn | ............... 333/24 R |
| 5,107,411 A | * | 4/1992 | Misdom | ............... 363/20 |
| 5,781,077 A | * | 7/1998 | Leitch et al. | ............... 332/117 |
| 6,924,724 B2 | * | 8/2005 | Grilo et al. | ............... 336/145 |
| 7,129,803 B2 | * | 10/2006 | Khorram et al. | ............... 333/25 |

* cited by examiner

*Primary Examiner*—Robert Pascal
*Assistant Examiner*—Kimberly E Glenn
(74) *Attorney, Agent, or Firm*—Bever, Hoffman & Harms, LLP; Jeanette S. Harms

(57) ABSTRACT

An RF coupling circuit including a transformer and a parallel AC-coupling capacitor can advantageously ameliorate substantial attenuation of a signal, prevent destabilization of any feedback loop, and simplify the circuit design process. The AC-coupling capacitor can act as an "averager", i.e. both the input and output sides of coupling circuit represent capacitances equal to the average of the input and the output capacitances. Thus, the inductors for tuning them out can become equal, thereby allowing a symmetric (or near symmetric) transformer to be used in the RF coupling circuit. When tuned properly, the transformer plus AC-coupling capacitor can also advantageously provide better in-band gain as well as frequency selectivity than other conventional coupling circuits.

10 Claims, 13 Drawing Sheets

$$\frac{I_{out}(s)}{I_{in}(s)} = \frac{s^2 K \sqrt{L_1 L_2} \, C_2}{S^4(1-K^2)L_1L_2C_1C_2 + 2s^3\left(\frac{\omega_0}{Q}\right)L_1L_2C_1C_2 + s^2\left(L_1C_1 + L_2C_2 + \left(\frac{\omega_0}{Q}\right)^2 L_1L_2C_1C_2\right) + s\left(\frac{\omega_0}{Q}\right)(L_1C_1 + L_2C_2) + 1}$$

500 ⟶

FIG. 5A $$\frac{I_{out}(j\omega_0)}{I_{in}(j\omega_0)} = \frac{-K\sqrt{X_1 X_2}\sqrt{\frac{C_2}{C_1}}}{(1-K^2)X_1X_2(X_1+X_2) + 1 + j\left(\frac{(X_1+X_2) - 2X_1X_2}{Q}\right)}$$

$$f(X_1, X_2) = \frac{(1-K'^2)X_1X_2 - (X_1+X_2) + 1}{\sqrt{X_1X_2}} + j\left(\frac{(X_1+X_2) - 2X_1X_2}{Q\sqrt{X_1X_2}}\right)$$

$$f(X) = \frac{(1-K'2)X^2 - 2X + 1}{\sqrt{X}} + j\left(\frac{2-2X}{Q}\right)$$

$$X = \frac{1}{1+K}$$

FIG. 5E $$A = a\sqrt{\dfrac{C_{1eff}}{C_{2eff}}} = a\sqrt{\dfrac{C_1 + C_c(1-A)}{C_2 - C_c\dfrac{1-A}{A}}} \quad 1001$$

$$A^2\left(C_2 - C_c\dfrac{1-A}{A}\right) = a^2[C_1 + C_c(1-A)] \quad 1002$$

$$A_2(C_2 + C_c) - AC_c(1-a^2) - a^2(C_1 + C_c) = 0 \quad 1003$$

$$A = \dfrac{C_c(1-a^2) + \sqrt{C_c^2(1-a^2)^2 + 4a^2(C_1+C_c)(C_2+C_c)}}{2(C_2+C_c)} \quad 1004$$

$$A = \sqrt{\dfrac{C_1+C_c}{C_2+C_c}} \quad \text{if } a \approx 1 \quad 1005$$

FIG. 10

INTER-STAGE COUPLING WITH A TRANSFORMER AND PARALLEL AC-COUPLING CAPACITOR

BACKGROUND OF THE INVENTION

1. Field of the Invention

The present invention relates to a radio frequency (RF) coupling circuit including both a transformer and a parallel AC-coupling capacitor.

2. Related Art

In a cascaded amplifier, AC-coupling must often be used between stages because the DC bias of the output of one stage output does not always match the desired DC bias of the input of the next stage. Often, a capacitor provides the AC-coupling and the DC bias of the next stage is provided by a resistor. Unfortunately, this technique may require a large AC-coupling capacitor if the next stage exhibits a low impedance. Moreover, undesired substantial attenuation of the signal may result. Additionally, a resistor for the bias element cannot be implemented in some techniques that require fast modulation of the DC bias of the next stage in a feedback loop (for example dynamic bias), because the resulting RC-delay can destabilize the feedback loop.

Alternatively, an asymmetric transformer for inter-stage coupling can be used. However, an asymmetric transformer operating at RF frequencies may be very difficult to design in both theory and physical implementation.

Therefore, a need arises for an RF coupling circuit that can prevent substantial attenuation of a signal, prevent de-stabilization of a feedback loop, and simplification of the circuit design process.

SUMMARY OF THE INVENTION

An RF coupling circuit including a transformer and a parallel AC-coupling capacitor can advantageously ameliorate substantial attenuation of a signal, prevent de-stabilization of any feedback loop, and simplify the circuit design process. The AC-coupling capacitor can act as an "averager", i.e. both the input and output sides of coupling circuit represent capacitances equal to the average of the input and the output capacitances. Thus, the inductances for resonating with the capacitances out can become equal, thereby allowing a symmetric (or near symmetric) transformer to be used in the RF coupling circuit. When tuned properly, the transformer plus AC-coupling capacitor can also advantageously provide better in-band gain as well as frequency selectivity than other, conventional coupling circuits.

In general, this RF coupling circuit can include first and second tuned loads and a coupling factor between the first and second tuned loads, wherein the coupling factor can include both inductive and capacitive coupling terms. An implemented RF coupling circuit can include input and output voltage terminals, first and second capacitances, first and second inductors, and a coupling capacitor. The first capacitance can be connected between the input voltage terminal and a first AC ground. The first inductor can be connected between the input voltage terminal and a first DC bias voltage. The second capacitance can be connected between the output voltage terminal and a second AC ground. The second inductor can be connected between the output voltage terminal and a second DC bias voltage, wherein the first and second inductors can be inductively coupled. The coupling capacitor can be connected between the input and output voltages. In one embodiment, the coupling capacitor has a capacitance of the same order of magnitude as the first and second capacitances (e.g. between 300-800 fF). In another embodiment, a capacitance of the coupling capacitor is at least 5 times, e.g. between 5 to 10 times, a capacitance of the larger of the first and second capacitances.

A method of coupling to tuned loads is also provided. In this method both an inductive coupling and a capacitive coupling are provided between the tuned loads. Providing the inductive coupling can be performed by a transformer, e.g. a substantially symmetrical transformer. Providing the capacitive coupling can be performed by a capacitor having a capacitance either of the same order of magnitude as the first and second capacitances, or substantially larger.

BRIEF DESCRIPTION OF THE DRAWINGS

FIG. 5A illustrates a transfer function for which one can maximize the output current of the RF coupling circuit with respect to the values of inductors that are inductively coupled.

FIG. 5B illustrates a simplified version of the transfer function of FIG. 5A.

FIG. 5C illustrates the inverse equivalent of transfer function as a function of $X_1$ and $X_2$.

FIG. 5D illustrates a simplified version of the transfer function of FIG. 5C.

FIG. 5E illustrates a solution that optimizes the magnitude of the transfer function of FIG. 5D.

FIG. 10 illustrates a series of equations that solve for the transformer gain.

DETAILED DESCRIPTION OF THE DRAWINGS

Figure 1:
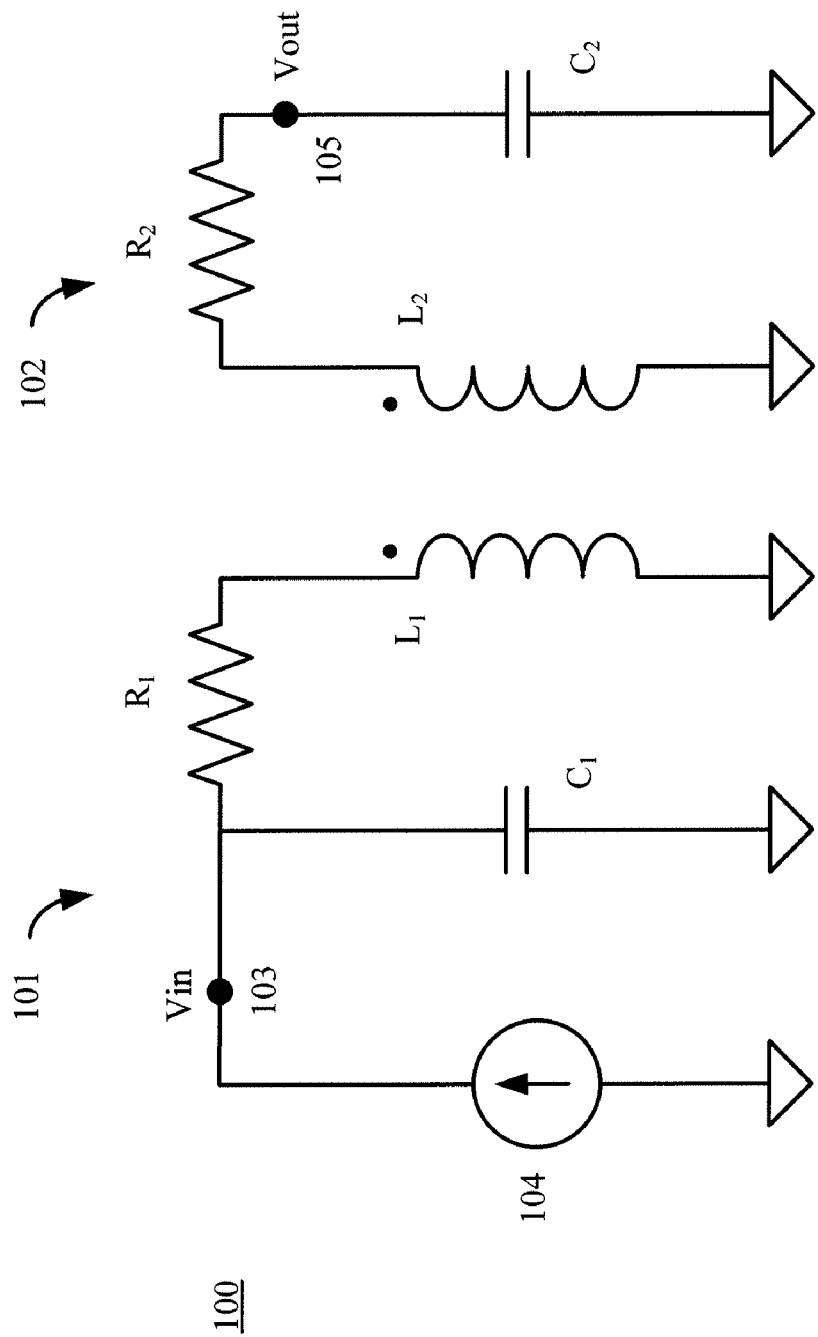
FIG. 1 illustrates an exemplary prior art RF coupling circuit including a transformer (including resistive losses).

FIG. 1 illustrates an exemplary prior art circuit 100 that can be used to provide stages of a cascaded amplifier. In circuit 100, an input side 101 includes three "legs", each leg being connected to an input voltage (Vin) node 103. In the first leg, a current source 104, which can represent an amplifier output, can be connected between ground (GND) and node 103. In the second leg, a capacitor $C_1$ can be connected between GND and node 103. In the third leg, an inductor $L_1$ and its associated physical resistance, represented by a resistor $R_1$, can be connected between GND and node 103. Note that the resistance of resistor $R_1$ can be defined as $R_1=\omega*L_1/Q$ (wherein the quality factor Q is defined by the ratio between the stored magnetic power and the dissipated power in the circuit (thus, the higher the Q, the smaller the power lost)). Therefore, as resistance $R_1$ goes to zero, the quality factor Q goes to infinity.

In this embodiment, an output side 102 of circuit 100 includes two legs, each leg being connected to an output voltage (Vout) node 105, which in turn could be connected to, for example, an amplifier stage or an antenna. In one leg, an inductor $L_2$ and its associated physical resistance, represented by a resistor $R_2$, can be connected between GND and node 105. Note once again that the resistance of resistor $R_2$ can be defined as $R_2=\omega*L_2/Q$. Therefore, as resistance $R_2$ goes to zero, the quality factor Q goes to infinity. In another leg of second output side 102, a capacitor $C_2$ can be connected between GND and node 105.

Note that capacitors $C_1$ and $C_2$ may be distributed parasitic capacitances (e.g. from MOS devices and metal interconnect) in circuit 100, but are referenced herein as capacitors for simplicity. Further note that GND is useful for describing circuit 100 during small-signal analysis. In an actual circuit, for example, capacitor $C_1$ can be connected to a first AC ground, capacitor $C_2$ can be connected to a second AC ground, inductor $L_1$ can be connected to a first DC bias voltage (e.g. VDD, because the driving voltage source is powered through this inductor), and inductor $L_2$ can be connected to a second DC bias voltage (e.g. some node between GND and VDD having a value optimum for the input of the next gain stage)(wherein a constant DC bias voltage can be characterized as an AC ground). These "actual" GNDs are well known to those skilled in the art of RF coupling circuits and therefore are not described in detail herein.

Figure 2:
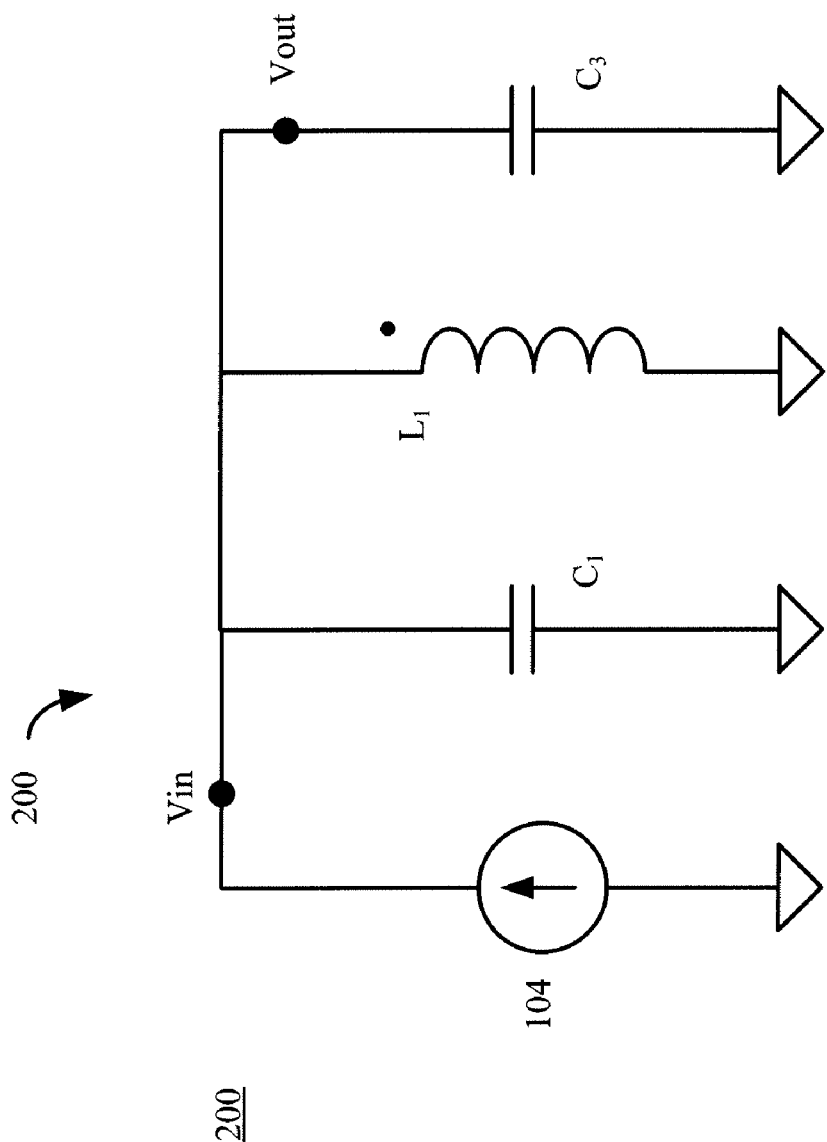
FIG. 2 illustrates a simplified version of the RF coupling circuit of FIG. 1 (wherein the resistive loss elements have been removed).

In circuit 100, assuming that the values for capacitors $C_1$ and $C_2$, Q, and K (a coupling ratio of the transformer, e.g. an ideal transformer results in a coupling ratio of 1) are fixed, one goal would be choosing values for inductors $L_1$ and $L_2$ to maximize output voltage Vout. To better understand the issues involved in this determination, consider an equivalent circuit 200 that does not include a transformer, as shown in FIG. 2. Note that circuit 200 assumes that K=1 and Q=infinity (i.e. no resistance), thereby further simplifying the model. Using these assumptions, capacitor $C_1$ represents the reflected impedance of the output capacitance, as seen from the primary input. Tuning $L_1$ yields the following relationship:

$$L1\left(C1 + \frac{L2C2}{L1}\right) = L1C1 + L2C2 = \frac{1}{\omega_0^2}$$

Figure 3:
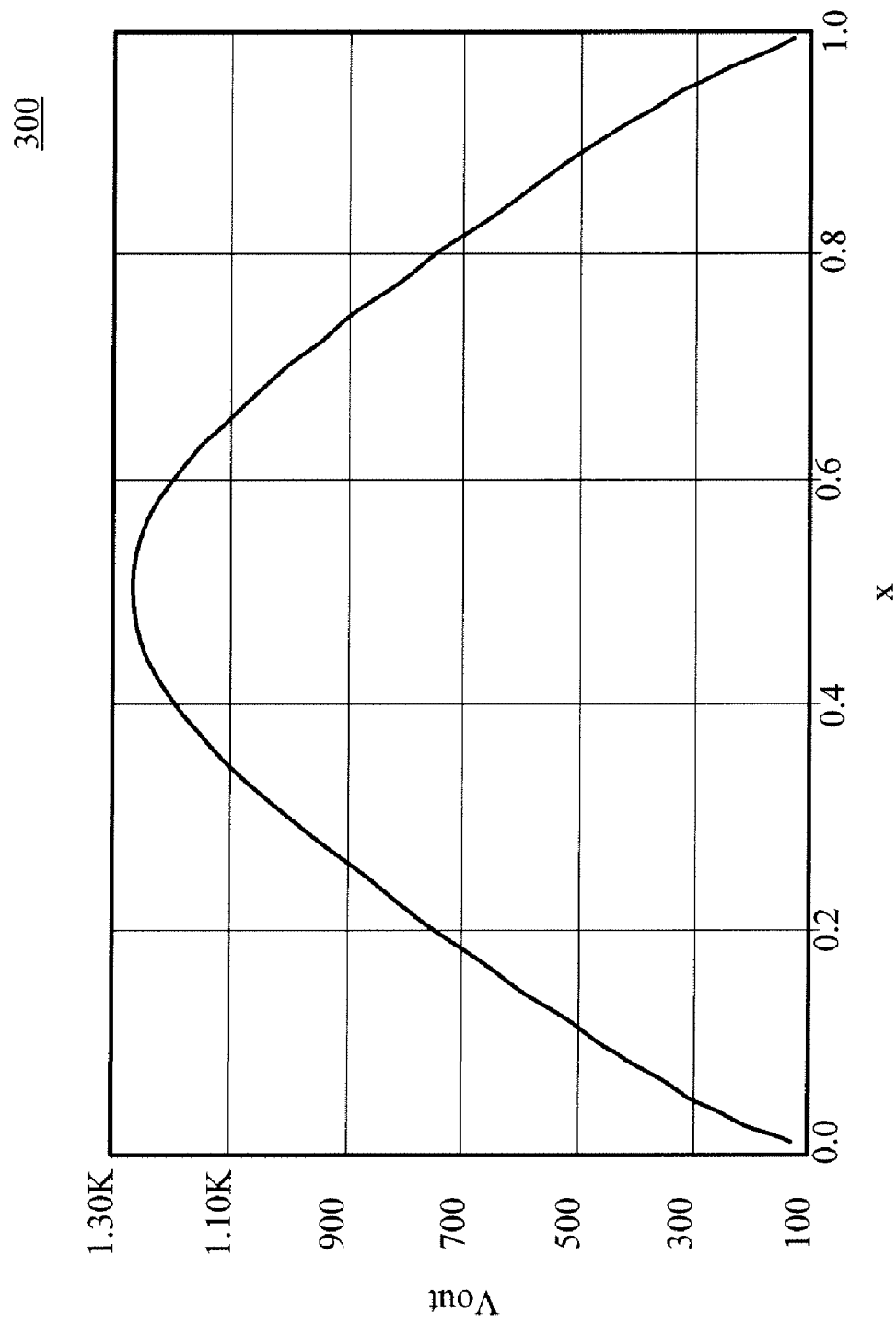
FIG. 3 illustrates a graph indicating an optimized solution to a tuning equation.

Note that based on the symmetry of this relationship, the same tuning equation would result from tuning from the secondary side. In any case, the solution to this equation is under-determined. However, as shown by a graph 300 shown in FIG. 3, a solution does exist for this equation. Specifically, graph 300 plots output voltage Vout versus "x" in the range $0<L_1<(\omega_0^2 C_1)^{-1}$ with $L_2$ governed by the constraint above. Note that the following assumptions have been made: Q=8, $f_0=\omega_0/2\pi=5$ GHz, $C_1=100$ fF, $C_2=400$ fF, and $L_1=x(\omega_0^2 C_1)^{-1}$.

Figure 4:
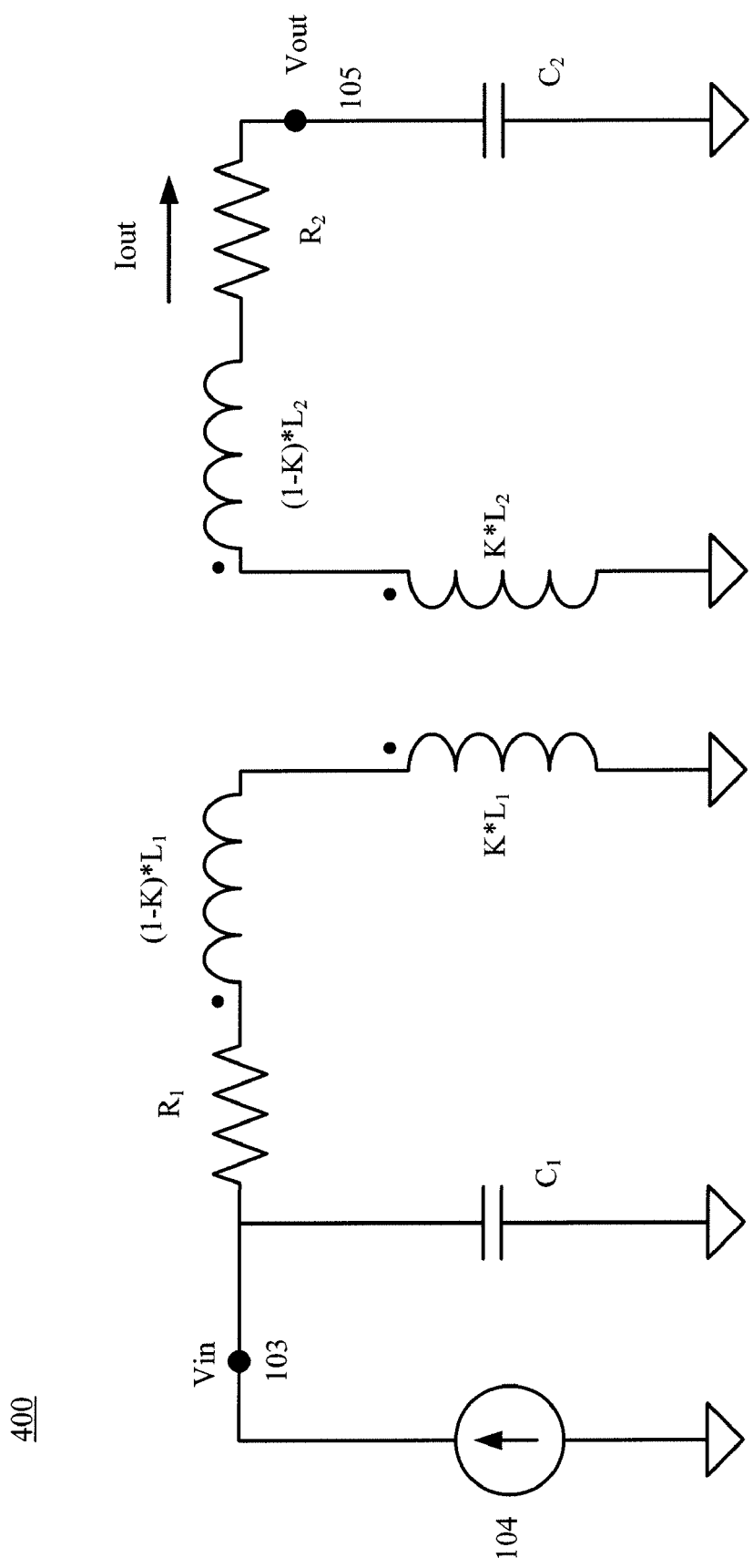
FIG. 4 illustrates an RF coupling circuit including a non-ideal (lossy) transformer.

Returning to the initial determination problem, the non-ideal transformer can be re-characterized as an ideal transformer (i.e. K=1) with leakage inductances in series with the input and output terminals. FIG. 4 illustrates an RF coupling circuit 400 including such an ideal transformer. Dots in FIG. 4 indicate points of the transformer that have the same polarity (i.e. points that are in-phase). Having the polarity dots in the manner shown indicates that the top leads of the primary and secondary windings (associated with inductors $L_1$ and $L_2$) have been wound in the same direction (e.g. wound clockwise from top to bottom).

In this configuration, one goal is to maximize the output current Iout with respect to inductors $L_1$ and $L_2$. FIG. 5A illustrates a transfer function 500 that characterizes this relationship. Transfer function 500 can be simplified using the following assumptions: $s=j\omega_0$; $\omega_0^2 L_1 C_1=X_1$; $\omega_0^2 L_2 C_2=X_2$; and $K'^2=K^2+(1/Q)^2$. FIG. 5B illustrates this simplified transfer function 510. Notably, maximizing this function is equivalent to minimizing its inverse. FIG. 5C illustrates the inverse equivalent of transfer function 510 as a function of $X_1$ and $X_2$ in equation 520.

Because of the symmetry of $X_1$ and $X_2$ in equation 520, $X_1$ and $X_2$ can be assumed to be equal at their optimum values. Therefore, "X" can be defined as $X=X_1=X_2$. FIG. 5D illustrates a simplified equation 530 using this defined "X". FIG. 5E illustrates a solution 540 for X that, to a very good approximation (e.g. an approximation accurate within 2% for $Q \geqq 5$ and $K \geqq 0.4$)), minimizes f(X). Note that solution 540 uses "K", not "K'". Notably, solution 540 implies that each inductor L looks like an "effective" inductance of L(1+K). Thus, the "Q enhancement" effect is the same as when a differential transformer load is used.

Note that with transformer coupling an "optimized" circuit has a fixed voltage transformation ratio. Thus, if $C_2>C_1$, as could be the case in a power amplifier, then the transformer steps down the voltage, thereby potentially creating some undesirable voltage swings on the primary (i.e. input) side. If these voltage swings are significant, then potential linearity problems can be generated.

Figure 6:
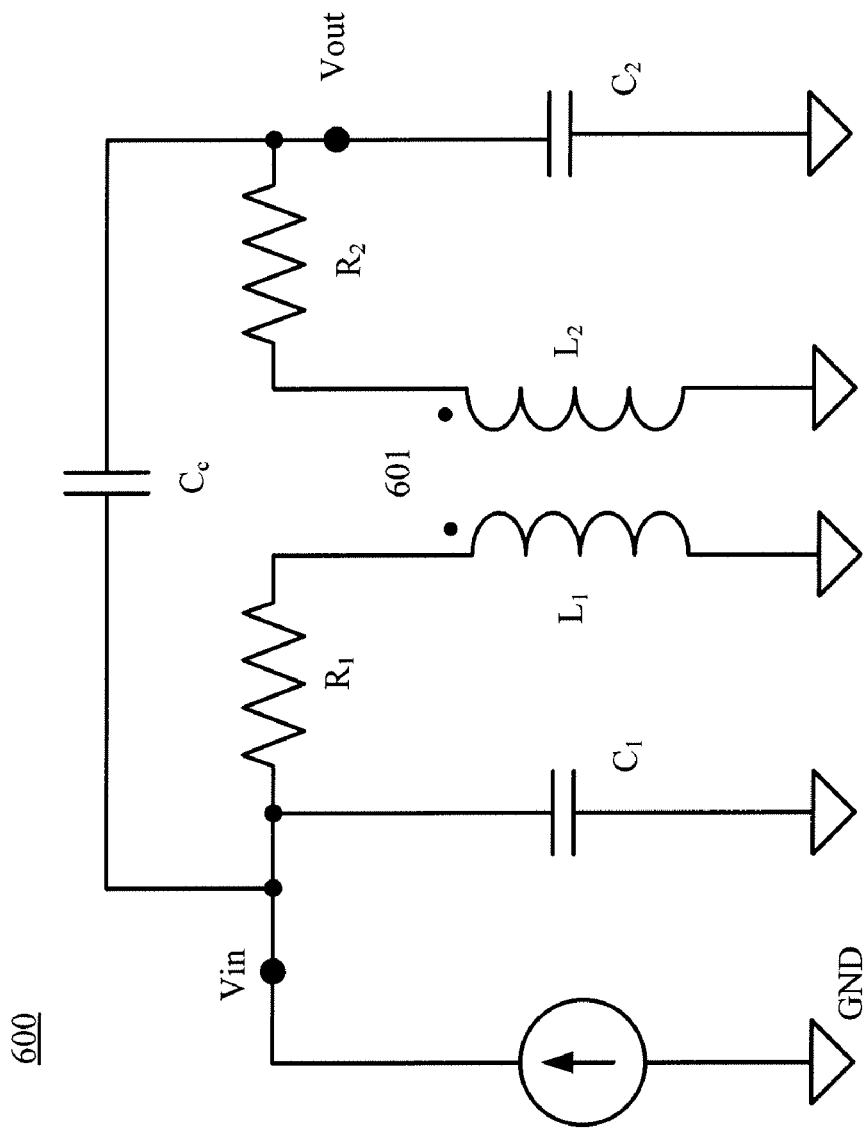
FIG. 6 illustrates an RF coupling circuit including an AC-coupling capacitor $C_c$ added in parallel with a transformer.

In accordance with one embodiment of an RF coupling circuit 600 shown in FIG. 6, an AC-coupling capacitor $C_c$ can be added in parallel with transformer 601 with minimal impact to the secondary (i.e. output) side). In this configuration, the voltage gain A of the transformer (formed with inductors $L_1$ and $L_2$) can be represented by the equation:

$$A = a * \text{square root of } (C_1/C_2)$$

wherein "a" can be set equal to 1 without loss of accuracy in excess of 1% if the conditions for the approximate solution are met, i.e. $Q \geqq 5$ and $K \geqq 0.4$. Note that a large ratio of $C_2$ to $C_1$ implies significant attenuation. However, as demonstrated below, coupling capacitor Cc can facilitate minimizing this attenuation.

Figure 7:
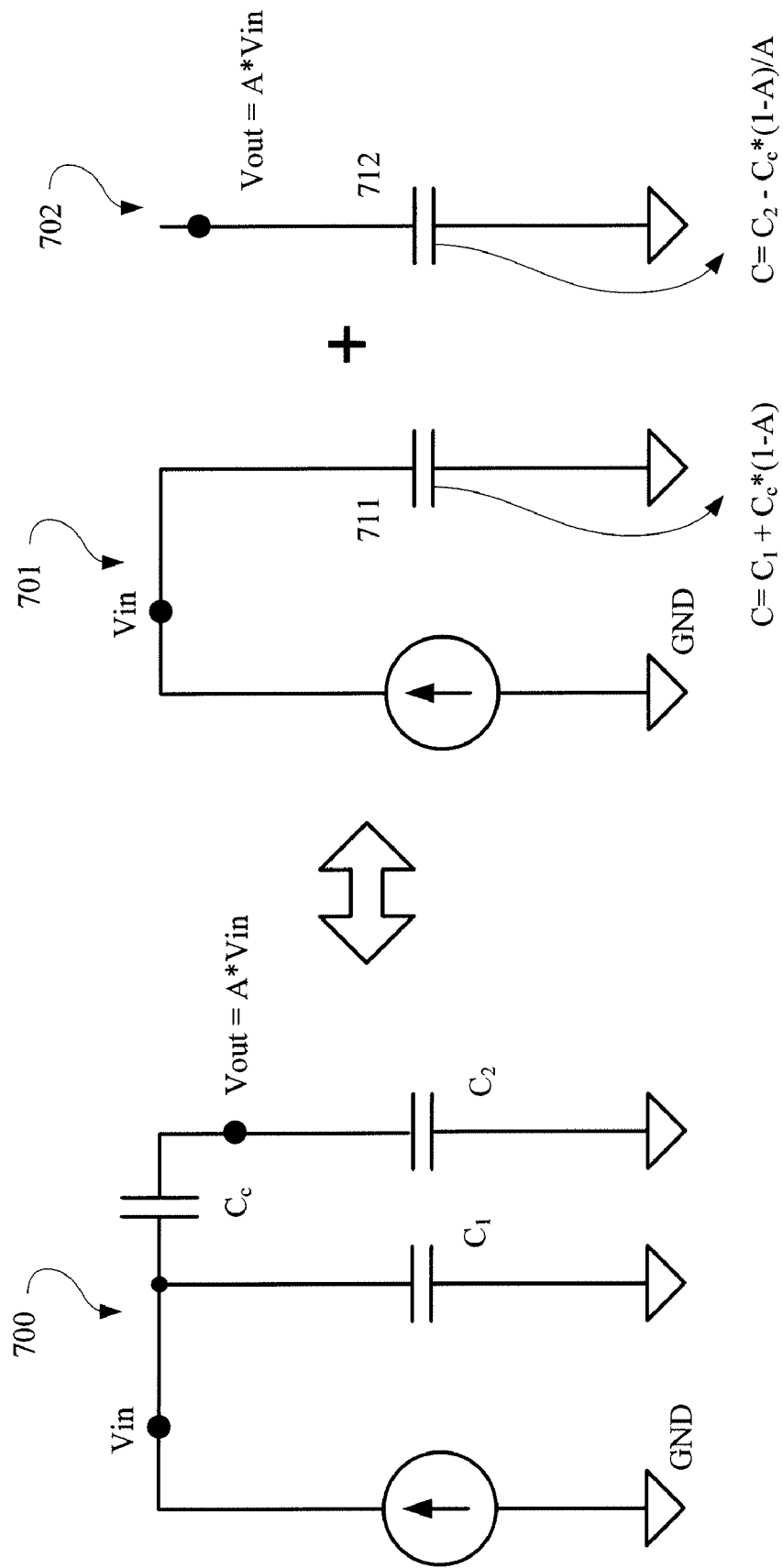
FIG. 7 illustrates a simplified representation of a transformer circuit.

FIG. 7 illustrates a simplified representation of a transformer circuit 700 including coupling capacitor $C_c$. Transformer circuit 700 can be further characterized as including a primary side 701 in which a capacitive element 711 has a capacitance equal to $C_1+C_c*(1-A)$ and a secondary side 702 in which a capacitive element 712 has a capacitance equal to $C_2-C_c*(1-A)/A$.

Figure 8:
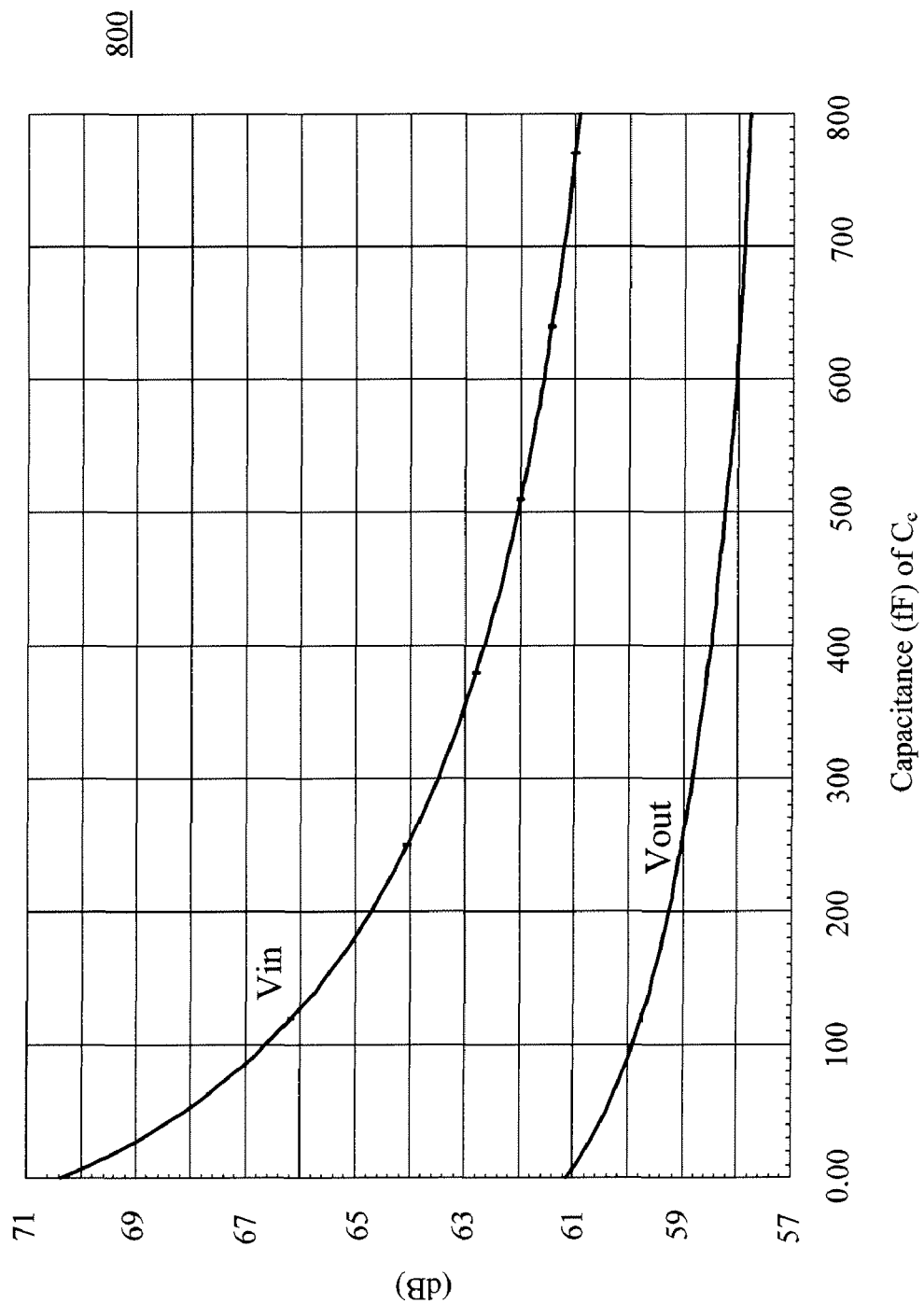
FIG. 8 illustrates a graph that plots voltages Vin and Vout curves as a function of the capacitance of the coupling capacitor, in which the inductance values are optimally chosen.

Thus, coupling capacitor $C_c$ adds capacitance to $C_1$ and subtracts capacitance from $C_2$, thereby bringing the effective ratio of $C_2$ to $C_1$ closer to unity. As a result, coupling capacitor $C_c$ can be exploited to retune the transformer to provide a new "effective" $C_1$ and $C_2$. For example, FIG. 8 illustrates a graph 800 that plots voltages Vin and Vout curves as a function of the capacitance (fF) of capacitor $C_c$ and dB. In this case, $C_1=100$ fF, $C_2=800$ fF, K=0.7, Q=7, and $f_0=2.5$ GHz. As shown in FIG. 8, increasing the capacitance of coupling capacitor $C_c$ can significantly reduce the voltage swing at Vin. Although the voltage swing at Vout is also reduced, this reduction represents a desirable tradeoff of gain for linearity.

Figure 9:
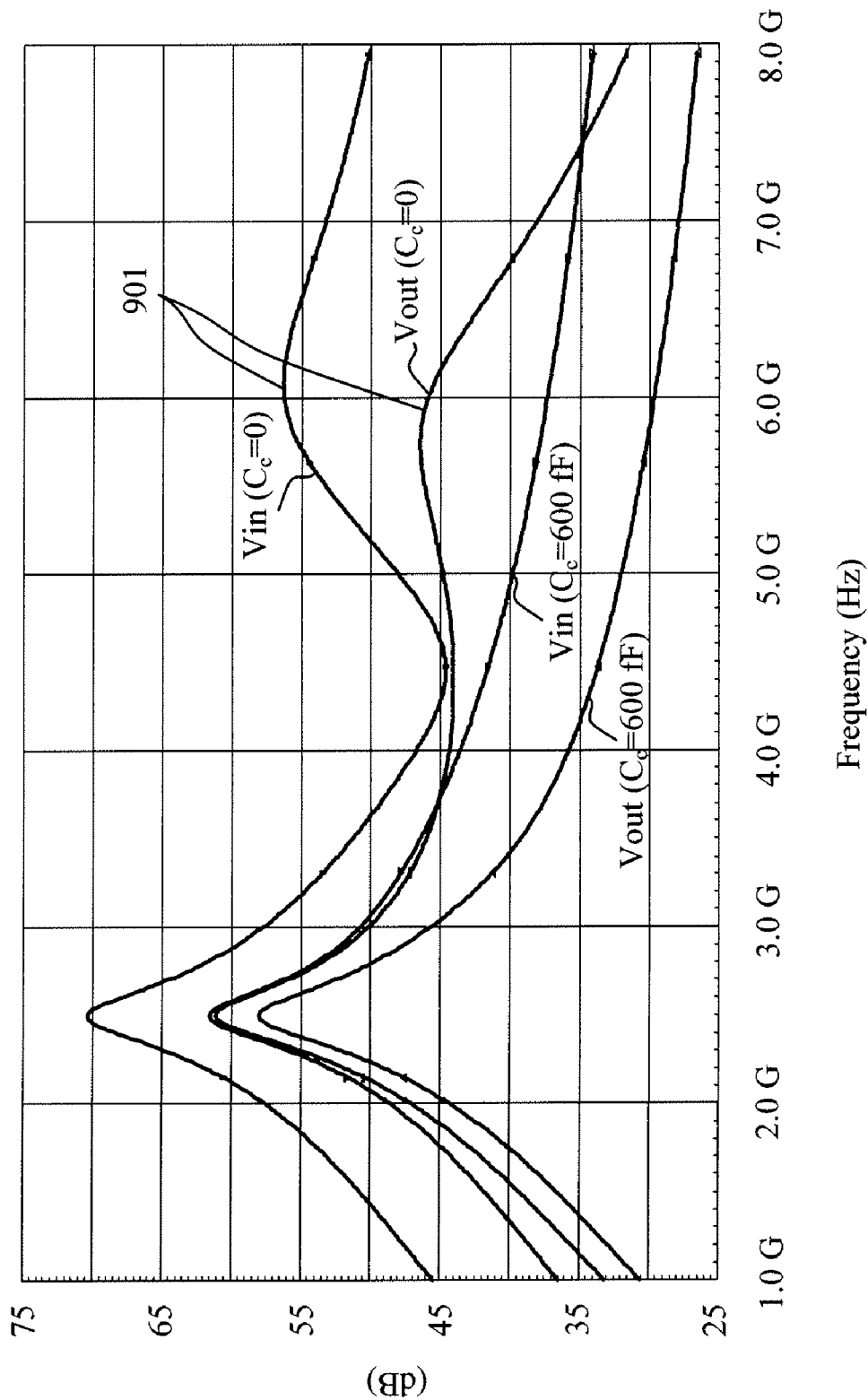
FIG. 9 illustrates a graph plotting voltages Vin and Vout with and without the coupling capacitor as a function of the frequency.

FIG. 9 illustrates a graph 900 plotting voltages Vin and Vout (in dB) for two capacitances of coupling capacitor $C_c$ as a function of frequency. As shown in graph 900, coupling capacitor $C_c$ can also significantly improve the wideband performance of the coupling circuit. Specifically, coupling capacitor $C_c$ (in this case, a capacitance of 600 fF) can remove the high frequency humps 901 in the transfer function.

If the transformer gain A is a function of $C_1$ and $C_2$, then $C_{1eff}$ and $C_{2eff}$ in the presence of coupling capacitor $C_c$ are functions of A. FIG. 10 illustrates a series of equations 1000 that solve for A. Equations 1001 indicate that $C_{1eff}$ is equal to $C_1+C_c(1-A)$, whereas $C_{2eff}$ is equal to $C_2-C_c((1-A)/A)$. Equation 1002 eliminates the square roots of equations 1001. Equation 1003 places all variables on one side of the equation. Equation 1004 solves for A using the quadratic formula. Equation 1005 simplifies equation 1004 by assuming that a is approximately equal to 1. Note that the value of A can be used to calculate $C_{1eff}$ and $C_{2eff}$ (see equations 1001), which in turn can be used to calculate the values for inductors $L_1$ and $L_2$.

Figure 11:
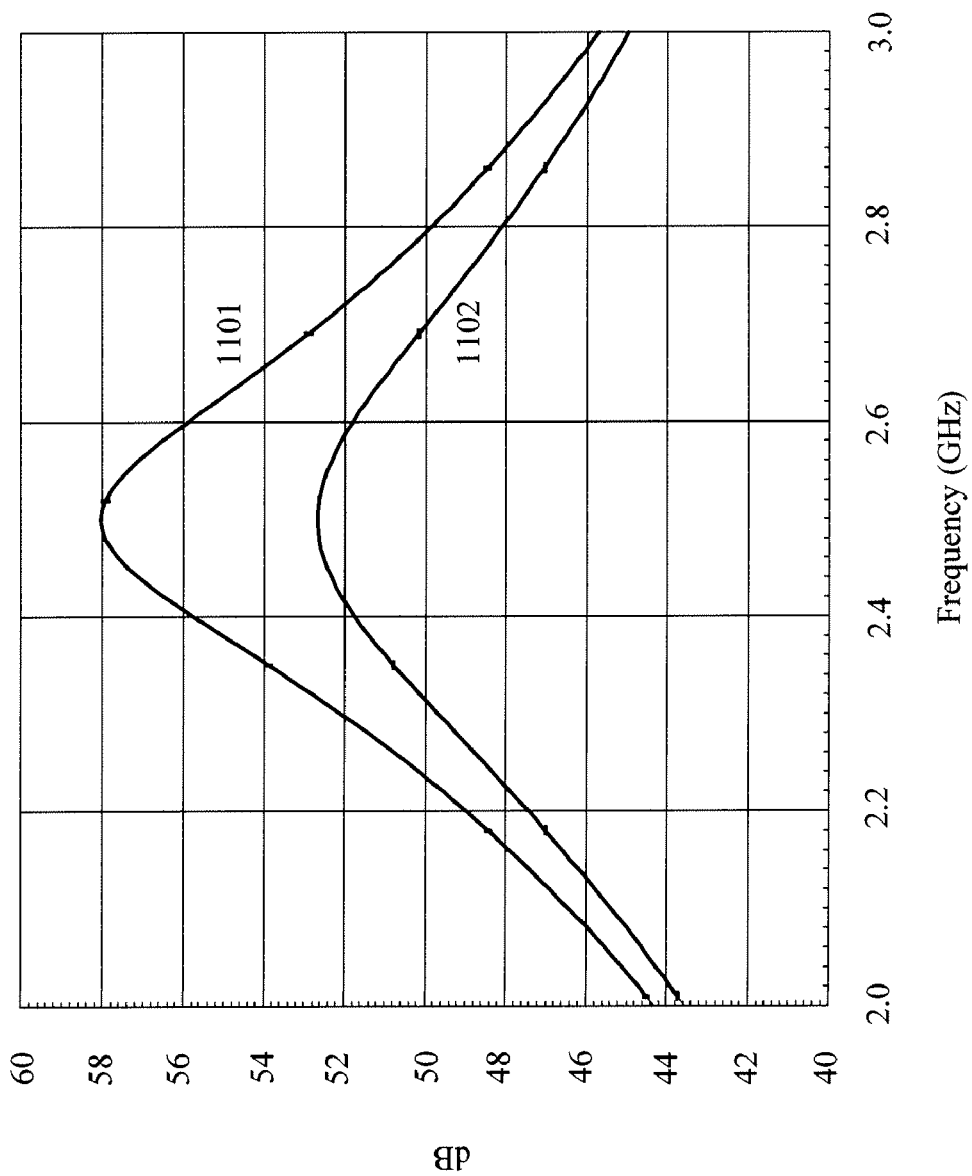
FIG. 11 illustrates a graph that plots a first curve (provided by a coupling circuit with a coupling capacitor and a transformer) and a second curve (provided by a theoretical coupling circuit with input and output capacitors shorted together) as a function of the amplitude in dB versus the frequency.

FIG. 11 illustrates a graph 1100 that plots a transfer function 1101 (with a coupling capacitor and a transformer) and a transfer function 1102 (in the theoretical case where the input and output capacitors are shorted together and tuned out with a single inductor only (i.e. not a transformer)) in dB as a function of frequency. In this case, curves 1101 and 1102 are generated using $C_1$=100 fF, $C_2$=800 fF, $C_c$=600 fF, K=0.7, Q=7, and $f_0$=2.5 GHz. Note that the transformer configuration can provide as much as 5 dB more gain than a single inductor with the theoretical shorted-out capacitor load. This additional gain is due to "Q-enhancement" and because the transformer circuit gives a $4^{th}$ order transform function (wherein each circuit with two coupled inductors, i.e. a transformer, and two capacitors are fourth-order).

Notably, as coupling capacitor $C_c$ is made much larger with respect to $C_1$ and $C_2$, the limit value of capacitors $C_1$ and $C_2$ can be expressed as $(C_1+C_2)/2$. Using this result, a symmetric 1:1 transformer can be designed, wherein each side of the transformer can be tuned to the average of $C_1$ and $C_2$. Thus, any capacitive AC-coupling design can be converted to a transformer-coupled design by retaining the AC-coupling capacitor and converting the load inductors to a transformer.

Figure 12:
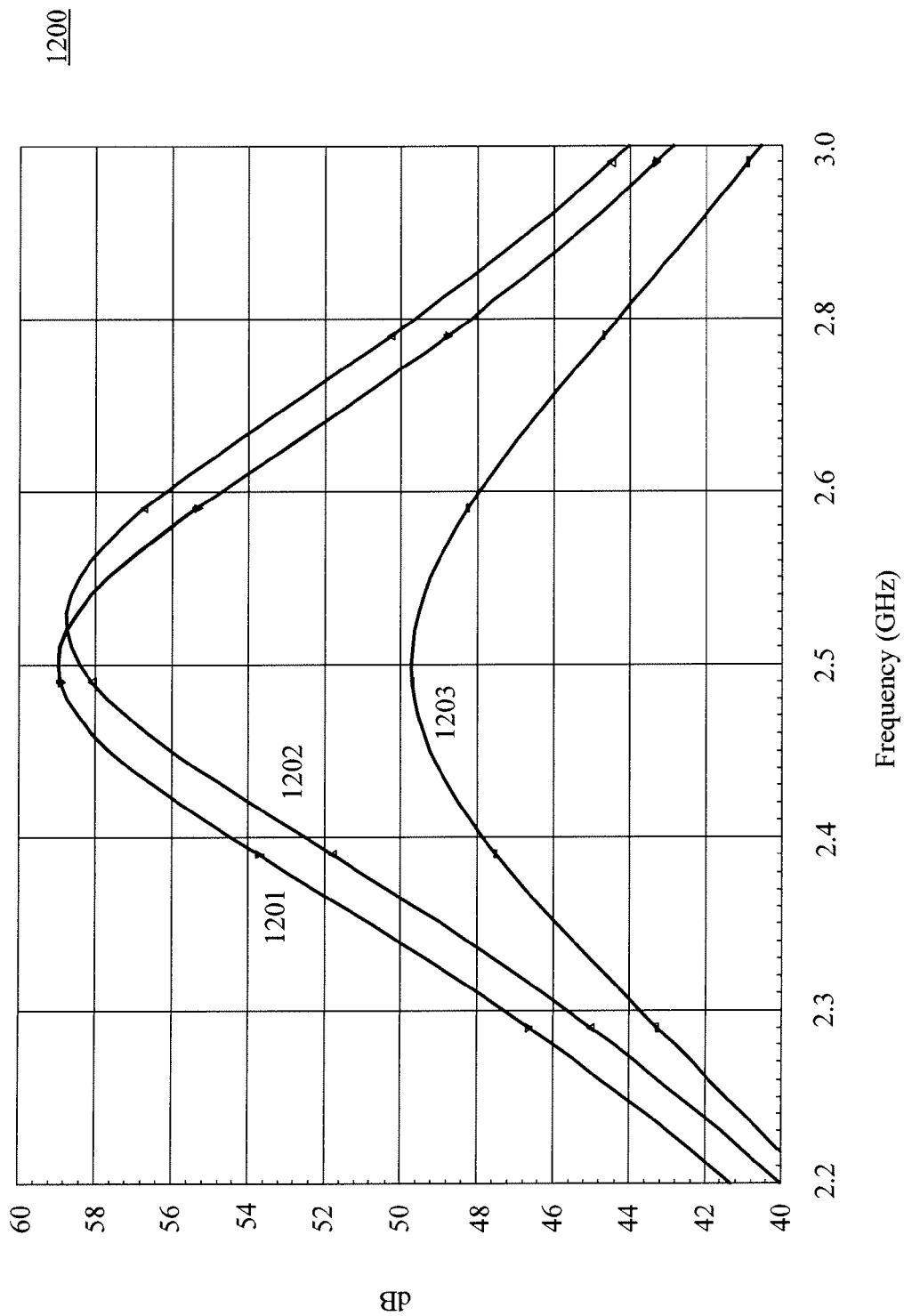
FIG. 12 compares the results for exactly tuning the primary and secondary of an asymmetrical transformer, tuning a symmetrical transformer using the approximations described above, and using only an inductor (in the theoretical case where the input and output capacitors are shorted together) for the RF coupling circuit.

FIG. 12 compares the results for exactly tuning the primary and secondary of an asymmetrical transformer (curve 1201), tuning a symmetrical transformer using the approximations described above (curve 1202), and using only an inductor (curve 1203) for the RF coupling circuit. In this case, curves 1201, 1202, and 1203 are generated using $C_1$=100 fF, $C_2$=600 fF, $C_c$=5 pF, K=0.7, Q=6, and $f_0$=2.5 GHz. As noted in graph 1201, the symmetrical transformer (curve 1202) merely shifts the resonant frequency with respect to the asymmetrical transformer (curve 1201). Advantageously, this effect can be compensated for to give substantially identical behavior to the exactly tuned transformer.

As known by those skilled in the art of RF transformers, the physical design of an asymmetric transformer may be complex. Fortunately, the addition of the coupling capacitor can bring the transformer turns ratio k closer to 1:1 (wherein large values of the coupling capacitor can allow 1:1 transformer), thereby dramatically reducing the complexity of the physical design. Note that the polarity of the primary and secondary windings of the transformer should be considered to ensure effectiveness.

Although illustrative embodiments of the invention have been described in detail herein with reference to the accompanying figures, it is to be understood that the invention is not limited to those precise embodiments. They are not intended to be exhaustive or to limit the invention to the precise forms disclosed. As such, many modifications and variations will be apparent. For example, the above-described RF transformer can be used in various types of RF circuits, e.g. low noise amplifiers, power amplifiers, and any inter-stage coupling between an RF gain stage output and an RF input. Accordingly, it is intended that the scope of the invention be defined by the following Claims and their equivalents.

The invention claimed is:

1. An RF coupling circuit comprising:
   a first tuned load including inductive and capacitive features;
   a second tuned load including inductive and capacitive features; and
   a coupling factor between the first and second tuned loads, wherein the coupling factor includes both inductive and capacitive coupling,
   wherein a transformer provides the inductive coupling, wherein a coupling capacitor provides the capacitive coupling, and wherein the coupling capacitor has a capacitance of a same order of magnitude as capacitances of the first and second tuned loads.

2. The RF coupling circuit of claim 1, wherein the first tuned load includes an input voltage terminal.

3. The RF coupling circuit of claim 1, wherein the second tuned load includes an output voltage terminal.

4. An RF coupling circuit comprising:
   a first tuned load including inductive and capacitive features;
   a second tuned load including inductive and capacitive features; and
   a coupling factor between the first and second tuned loads, wherein the coupling factor includes both inductive and capacitive coupling terms,
   wherein a transformer provides the inductive coupling, wherein a coupling capacitor provides the capacitive coupling, and wherein the coupling capacitor has a capacitance between 5 to 10 times a capacitance of a larger of the first and second tuned loads.

5. An RF coupling circuit comprising:
   an input voltage terminal;
   a first capacitance connected between the input voltage terminal and a first AC ground;
   a first inductor connected between the input voltage terminal and a first DC bias voltage;
   an output voltage terminal;
   a second capacitance connected between the output voltage terminal and a second AC ground;
   a second inductor connected between the output voltage terminal and a second DC bias voltage, the first and second inductors being inductively coupled; and
   a coupling capacitor connected between input and output voltage terminals.

6. The RF coupling circuit of claim 5, wherein the coupling capacitor has a capacitance of a same order of magnitude as capacitances of the first and second capacitances.

7. The RF coupling circuit of claim 5, wherein a capacitance of the second capacitance is at least 5 times a capacitance of the first capacitance.

8. The RF coupling circuit of claim 5, wherein a capacitance of the second capacitance is between 5 to 10 times a capacitance of the first capacitance.

9. A method of coupling to tuned loads, each of the tuned loads including inductive and capacitive features, the method including:
- providing an inductive coupling between the tuned loads; and
- providing a capacitive coupling between the tuned loads,
- wherein providing the inductive coupling is performed by a transformer, and wherein providing the capacitive coupling is performed by a capacitor of a same order of magnitude as capacitances of the tuned loads.

10. A method of coupling to tuned loads, each of the tuned loads including inductive and capacitive features, the method including:
- providing an inductive coupling between the tuned loads; and
- providing a capacitive coupling between the tuned loads,
- wherein providing the inductive coupling is performed by a transformer, and wherein providing the capacitive coupling is performed by a capacitance between 5 to 10 times a capacitance of a larger of the tuned loads.

* * * * *